US009368611B2

(12) United States Patent
Galy et al.

(10) Patent No.: US 9,368,611 B2
(45) Date of Patent: Jun. 14, 2016

(54) INTEGRATED CIRCUIT COMPRISING A MOS TRANSISTOR HAVING A SIGMOID RESPONSE AND CORRESPONDING METHOD OF FABRICATION

(71) Applicants: STMICROELECTRONICS (CROLLES 2) SAS, Crolles (FR); STMICROELECTRONICS S.A., Montrouge (FR)

(72) Inventors: Philippe Galy, Le Touvet (FR); Patrice Dehan, La Tronche (FR); Boris Heitz, Grenoble (FR); Jean Jimenez, Saint Théoffrey (FR)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 10 days.

(21) Appl. No.: 13/853,111

(22) Filed: Mar. 29, 2013

(65) Prior Publication Data
US 2014/0124866 A1 May 8, 2014

(30) Foreign Application Priority Data

Apr. 6, 2012 (FR) ..................................... 12 53236

(51) Int. Cl.
*H01L 29/66* (2006.01)
*H01L 29/78* (2006.01)
(Continued)

(52) U.S. Cl.
CPC ............. *H01L 29/78* (2013.01); *H01L 27/0727* (2013.01); *H01L 29/41775* (2013.01); *H01L 29/66553* (2013.01); *H01L 29/66628* (2013.01); *H01L 29/66643* (2013.01); *H01L 29/7839* (2013.01)

(58) Field of Classification Search
USPC .......................................................... 257/368
See application file for complete search history.

(56) References Cited

U.S. PATENT DOCUMENTS

| 6,646,307 B1 * | 11/2003 | Yu et al. ......................... 257/347 |
| 7,092,923 B2 * | 8/2006 | Arima ..................... G06N 3/063 257/E27.07 |
| 2004/0108537 A1 * | 6/2004 | Tiwari ............... H01L 21/28273 257/314 |

(Continued)

FOREIGN PATENT DOCUMENTS

| JP | 11054771 | 2/1999 |
| WO | 03/107433 | 12/2003 |

OTHER PUBLICATIONS

Chen et al. "A New Type of CMOS Inverter With Lubistor Load and TFET Driver for Sub-20 nm Technology Generation" 2010 IEEE 978-1-4244-5798-4/10).

(Continued)

*Primary Examiner* — Monica D Harrison
(74) *Attorney, Agent, or Firm* — Allen, Dyer, Doppelt, Milbrath & Gilchrist, P.A.

(57) ABSTRACT

An integrated circuit may include at least one MOS transistor having a sigmoid response. The at least one MOS transistor may include a substrate, a source region, a drain region, a gate region, and insulating spacer regions on either side of the gate region. The substrate may include a first region situated under the gate region between the insulating spacer regions. At least one of the source and drain regions may be separated from the first region of the substrate by a second region of the substrate situated under an insulating spacer region, which may be of a same type of conductivity as the first region of the substrate.

9 Claims, 6 Drawing Sheets

(51) Int. Cl.
    *H01L 29/417* (2006.01)
    *H01L 27/07* (2006.01)

(56) References Cited

U.S. PATENT DOCUMENTS

| | | | |
|---|---|---|---|
| 2006/0192232 A1 | 8/2006 | Ando | |
| 2008/0277732 A1* | 11/2008 | Shima | H01L 21/823807 257/368 |
| 2010/0072528 A1 | 3/2010 | Inokuchi et al. | |
| 2011/0227156 A1 | 9/2011 | Khater et al. | |
| 2012/0012933 A1 | 1/2012 | Cheng et al. | |

OTHER PUBLICATIONS

Coon et al. "Neuron-Like Transient Phenomena in Silicon P-I-N Structures" Solid-State Electronics vol. 31, No. 5, pp. 851-862; 1988.
Lin et al. "GaAs Optoelecrtonic Neuron Arrays" Applied Optics Mar. 10, 1993 vol. 32, No. 8; pp. 12751289.
Ohmi et al. "Device Characterization of High-Electron-Mobility Transistors With Ferroelectric-Gate Structures" GaAs IC Symposium pp. 163-166. IEEE 1996 (0-7803-3504-X/96).
Ohmura, Yasuhisa "A Simple and Advanced Neural Circuit Element by Using an SOI Insulated-Gate PN" 1998 IEEE Internationa SOI Conference Oct. 1998.
Nawrocki et al. "A Neuromorphic Architecture From Single Transistor Neurons With Organic Bistable Devices for Weights" Proceeding of International Joint Conference on Neural Networks, San Jose, CA; Jul. 31-Aug. 5, 2011; pp. 450-456.
Nishisaka et al. "Reduction of the Floating-Body Effect in SOI MOSFETs by Using Schottky Source/Drain Contacts" Extended Abstracts OFTEH 1997 Intetrnation Conference on Solid State Devices and Materials, Hamamasu, 1997 pp. 160-161.
Qiu et al. "Modeling of Neuron Based on Single Electron Transistor" 2009 International Joint Conference on Computations Sciences and Optimization; pp. 359-363.
Muklis et al. "Design of Neural Network Circuit Inside High Speed Camera Using Analog CMOS 0.35 um Technology", Industrial Electronic Seminar, 2009, 4 pgs.
Hynna et al. "Neuronal Ion-Channel Dynamics in Silicon", IEEE International Symposium on Circuits and Systems, pp. 3614-3617, IEEE Press, 2006, pp. 3614-3617.
Frank Elie "These: Conception et realisation d'un systeme utilisant desreseaux de neurones pour l'identification et la caracterisation, a bard de satellites, de signaux transitoires de type sifflement" Dec. 23, 1997, pp. 179 (English Abstract Only on p. 179).
M. Laurent Gatet "Doctorat de l'Universite De Toulouse Integration de Reseaux de Neurones pour la Telemetrie Laser" Sep. 27, 2007. pp. 199 (English Abstract Pages C & D).
G. Dreyfus "Les Reseaux de neurones" Ecole Superieure de Physique et de Chimie Industrielles de la Ville de Paris (ESPCI) Sep. 1998; pp. 19.

* cited by examiner

INTEGRATED CIRCUIT COMPRISING A MOS TRANSISTOR HAVING A SIGMOID RESPONSE AND CORRESPONDING METHOD OF FABRICATION

FIELD OF THE INVENTION

The present invention relates to integrated circuits and, more particularly, to isolated gate metal oxide semiconductor (MOS) transistors and related methods.

BACKGROUND OF THE INVENTION

MOS transistors typically include a gate region, spacers situated on either side of the gate, and source and drain regions. The source and drain regions typically include a doped region in the substrate beside the gate, and also a lightly doped region (e.g., lightly doped drain (LDD) region) which is shallow and runs under the spacers to meet a region of the substrate situated under the gate. The substrate region under the gate corresponds to the channel in which the charge carriers move, and it is in contact with the source and drain regions. To form the source and drain regions, several dopant implantation steps are performed.

One application of interest for MOS transistors is for circuits which form artificial neural networks. Human neurons have a sigmoid response. This response may be reproduced by circuits including a plurality of conventional MOS transistors. For this purpose, reference may be made to the article by K. M. Hynna and K. Boahen entitled "Neuronal Ion-Channel Dynamics in Silicon", IEEE International Symposium on Circuits and Systems, pp 3614-3617, IEEE Press, 2006, or to the article by Mukhlis and Yulisdin entitled "Design Of Neural Network Circuit Inside High Speed Camera Using Analog CMOS 0.35 ¼ m Technology", Industrial Electronic Seminar, 2009, which describe complex circuits forming artificial neurons, in which each neuron is formed by several transistors.

SUMMARY OF THE INVENTION

An object of the invention is to provide a method for fabricating a MOS transistor with fewer fabrication steps than those used for the fabrication of a conventional transistor.

Another object of the invention is to provide a relatively robust transistor having a reduced power consumption.

According to one embodiment, a MOS transistor structure is provided which may have a current-voltage characteristic approximating or providing a sigmoid curve. This allows an artificial neuron to be formed with a single transistor, and hence the structure of circuits forming networks of artificial neurons to be simplified. A sigmoid curve is, for example, a curve in the shape of an "S" or of the "arc tangent" type, or a "hyperbolic tangent" type.

According to another aspect, an integrated circuit is provided which may include at least one MOS transistor having a substrate, a source region, a drain region, a gate region, and insulating spacer regions on either side of the gate region (commonly referred to by those skilled in the art as "spacers"). The substrate may include a first region situated under the gate region between the insulating spacer regions. At least one of the source and drain regions may be separated from the first region of the substrate by a second region of the substrate situated under an insulating spacer region, and having a same conductivity type as the first region of the substrate.

In one example MOS transistor structure, at least one of the source and drain regions (and optionally both) is not in direct contact with (i.e., is separated from) the first substrate region situated under the gate, as is the case in a conventional transistor by way of an LDD region under the spacer. Rather, the source and/or drain region is separated from the first region by a second substrate region of the same conductivity type, and which therefore contacts both the first substrate region and the source region and/or the drain region. It is therefore possible to avoid implantation of a dopant for the formation of the source region and/or the drain region, which may simplify the transistor fabrication process.

When a voltage is applied to the gate region of the transistor structure, an energy barrier may appear within the second region which is not under the gate region. This energy barrier does not appear in conventional MOS transistors in which the source and/or drain regions are in direct contact with the region of the substrate situated under the gate. When a sufficiently high potential difference is applied between the source and the drain, this energy barrier may be overcome or penetrated by charge carriers via a tunnel effect, allowing current to pass.

Accordingly, the above-described MOS transistor is different from a "tunnel FET", in which the tunnel effect relates to a passage from band to band. Instead, with the present configuration the energy barrier to be overcome is only within the conduction band.

In the present MOS transistor, conduction for too low of a value of source-drain voltage is prevented by energy barriers formed by the application of a voltage to the gate region. Thus, in contrast to a MOS transistor according to the prior art, there is no region referred to as a "linear region" when a low drain-source voltage value is applied. A transistor having such a structure exhibits a current-voltage response which approximates, or even corresponds, to a sigmoid response (e.g., in the shape of an "S").

The present MOS transistor may therefore by itself emulate an artificial neuron. It then becomes advantageous to use, in an integrated circuit, a plurality of these transistors interconnected to form a network of artificial neurons. As a result, circuit simplification and a gain in silicon surface area may be obtained.

Furthermore, the currents flowing through such a transistor are relatively low, which may reduce the power consumed by the transistor. Moreover, such a transistor, notably without implantations, may be more robust than a conventional transistor.

To come closer to a sigmoid response, the source and drain regions may be separated from the first substrate region in the manner indicated above. The source and/or drain regions may comprise, at the surface of the substrate, a doped semiconductor material of an opposite conductivity type to that of the first region of the substrate. For example, a thin layer of doped material may be formed during an epitaxial growth step.

In another example, when the substrate region under the gate region has a P-type conductivity, the source and/or drain region may comprise a metal material at the surface of the substrate. The metal material may be a layer of metal silicide allowing a contact to be made with the surface of the substrate, for example. It should be noted that, in contrast to a conventional MOS transistor, this metal silicide may be formed directly on a substrate of the same conductivity type as the region of the substrate situated under the gate region. Thus, a Schottky diode is formed between the source and/or drain region and the second region of the substrate (which runs under the spacer), which also has a P-type conductivity. In typical prior art devices, the region situated under a spacer is of the opposite conductivity type to that of the channel region, so that it is not possible to form a diode at that location.

It should also be noted that, in this example embodiment, the transistor is of the NMOS type, and thus the charge carriers are electrons from the layer of metal material, rather than electrons obtained by an excess of electrons due to doping of the silicon.

A response having essentially the form of a sigmoid may be obtained by forming both a drain and a source with a metal material directly on the substrate, as described above. The dimension of the gate region measured along the source-drain direction may be less than or equal to twenty eight nanometers, for example. By forming a gate region having a length of twenty eight nanometers or less, spacers with a relatively small dimension are also formed. Formation of the energy barriers under these spacers may therefore be more easily controlled by applying a voltage to the gate region. Shorter energy barriers may be overcome more easily.

Various spacer widths (or widths of the second region of the substrate) may be used. Indeed, the values of the voltages applied need only be raised sufficiently to allow the energy barriers to be overcome by the charge carriers. However, for widths exceeding about a hundred nanometers, the increase in the values of voltage may cause breakdown events, so it may be desirable to have this width be less than one hundred nanometers. By way of non-limiting example, for transistors having a gate region width of 28 nanometers, spacers having a width of around 4 nanometers may be formed.

According to another aspect, a method of fabrication of a MOS transistor is provided which may include forming a source and drain regions on a substrate, and forming a gate region and insulating spacer regions on either side of the gate region. The substrate may include a first region situated under the gate region between the insulating spacer regions. At least one of the source and drain regions may be separated from the first region of the substrate by a second region of the substrate situated under an insulating spacer region, and the second region may have a same conductivity type as the first region.

The formation of the at least one of the source and drain regions may comprise an epitaxial growth at the surface of the substrate including a doped semiconductor material of an opposite conductivity type to that of the first region of the substrate. The fabrication may be simplified in that the epitaxial growth step may be implemented directly on a substrate without the need for a source and/or drain dopant implantation step.

In accordance with another example, the substrate region under the gate region may be of a P-type conductivity. As such, formation of the at least one of the source and drain regions may include, at the surface of the substrate, forming the at least one of the source and drain regions using a metal material. The metal material formation may include depositing a layer of metal and a silicidation of the metal layer.

The formation of a metal silicide may be particularly advantageous because, in contrast to a doped semiconductor layer, there is a reduced risk of a dopant diffusing towards the region situated under the gate region of the transistor. As a result, this may reduce the distance separating the source or drain region from the region of the substrate situated under the gate region.

As indicated above, both of the source and drain regions may be separated from the first region of the substrate by a third region of the substrate situated under an insulating spacer region. The third region may have the same type of conductivity as the first region.

BRIEF DESCRIPTION OF THE DRAWINGS

Other advantages and features of the invention will become apparent upon studying the detailed description of the embodiments and of their implementation, given by way of non-limiting examples and illustrated by the appended drawings, in which:

FIG. 2a is a schematic diagram of a MOS transistor according to one embodiment of the present invention, and FIG. 2b is a flow diagram illustrating corresponding fabrication aspects for the MOS transistor of FIG. 2a;

DETAILED DESCRIPTION OF THE PREFERRED EMBODIMENTS

Figure 1:
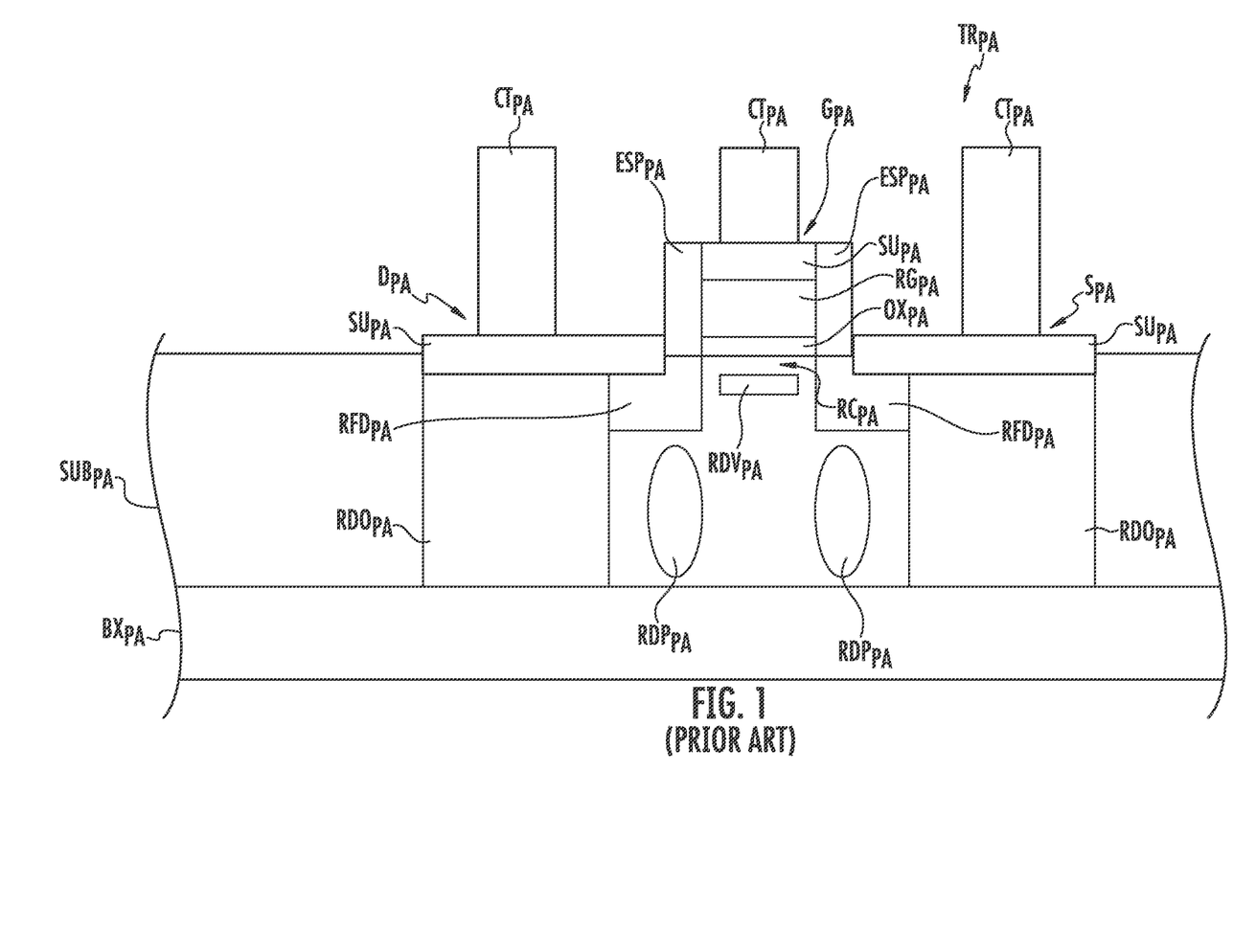
FIG. 1 is a schematic diagram of a MOSFET according to the prior art.

Referring initially to FIG. 1, a prior art MOSFET $TR_{PA}$ is shown. The transistor $TR_{PA}$ includes a gate region $G_{PA}$, a drain region $D_{PA}$ and a source region $S_{PA}$ formed on a substrate $SUB_{PA}$, which may be a silicon substrate, for example. The substrate $SUB_{PA}$ may be disposed on top of an insulating region $BX_{PA}$, e.g., an insulating region of a Silicon-On-Insulator (SOI) wafer, as will be appreciated by those skilled in the art. Each of the source and drain regions comprises a main doped region $RDO_{PA}$, formed by an implantation step, a lightly-doped region $RFD_{PA}$ (e.g., a LDD (Lightly Doped Drain) region), and a metal silicide $SU_{PA}$. The gate region $G_{PA}$ includes an insulating layer $OX_{PA}$, which may include silicon dioxide or a high-k dielectric material with a high dielectric constant k, for example. The insulating layer $OX_{PA}$ is covered by a region $RG_{PA}$ (e.g., polycrystalline silicon), which in turn is covered by a metal silicide $SU_{PA}$.

Typically, insulating spacer regions $ESP_{PA}$ are formed on either side of the gate region $G_{PA}$ and are situated on top of lightly-doped regions $RFD_{PA}$ of the substrate $SUB_{PA}$. Furthermore, under the gate region and between the spacers, there is a channel region $RC_{PA}$ which has a conductivity type opposite to that of the regions $RFD_{PA}$ and $RDO_{PA}$.

It should be noted that other doped regions may be formed in the substrate $SUB_{PA}$. For example, the regions $RDP_{PA}$, which are commonly referred to by those skilled in the art as "pockets", allow for the extension of the depletion regions between the regions $RDO_{PA}$ and the substrate $SUB_{PA}$ to be avoided. Another doped region $RDV_{PA}$ under the gate region may allow the threshold voltage of the MOSFET to be adjusted. Electrical contacts $CT_{PA}$ have also been formed on the silicide regions $SU_{PA}$ of the gate $G_{PA}$, source $S_{PA}$, and the drain $D_{PA}$ regions.

Figures 2A, 2B:
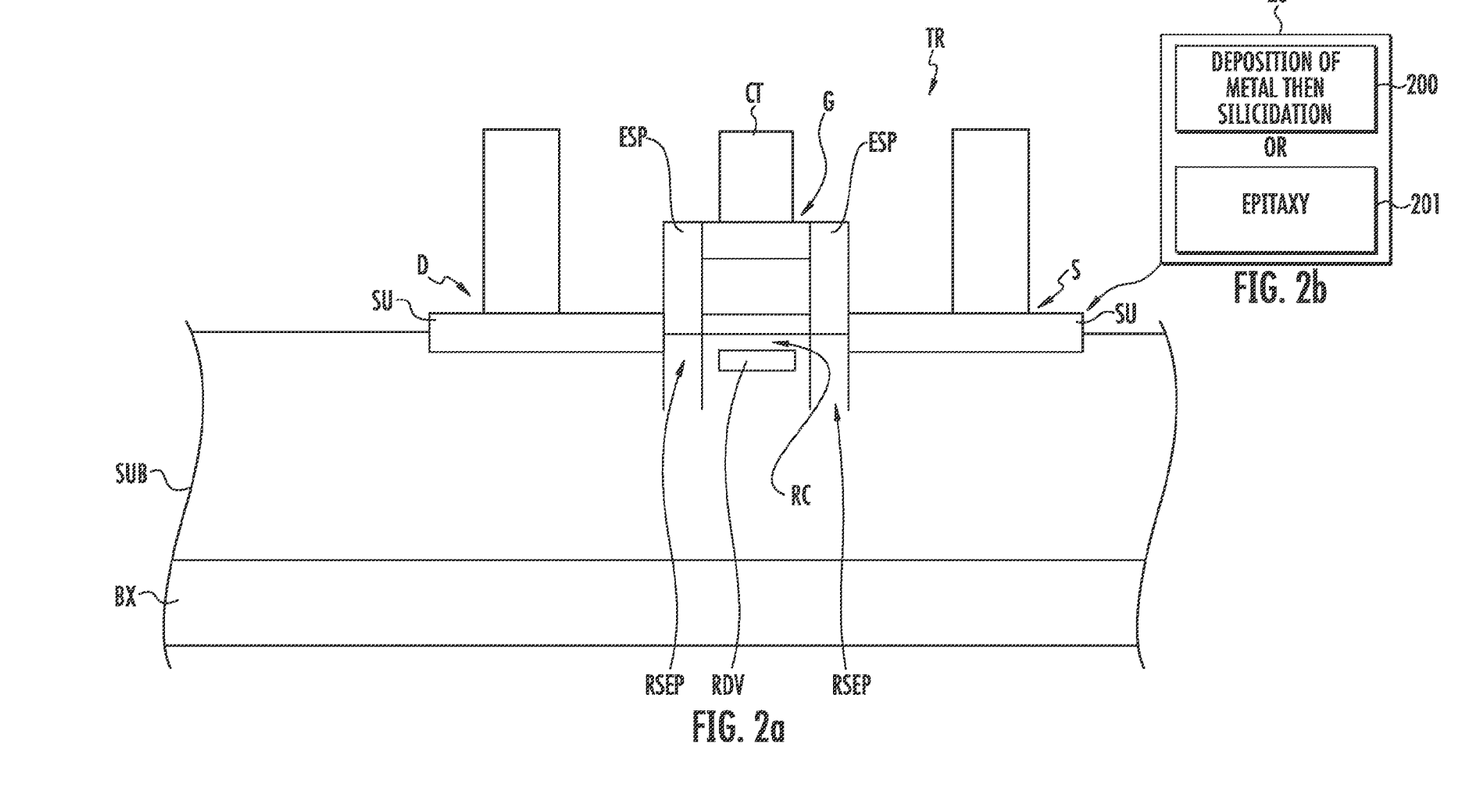

In FIG. 2a, an example embodiment of a transistor TR according to the invention is shown. The transistor TR has a gate region G, a drain region D, a source region S, and spacers ESP on top of a substrate SUB (e.g., a silicon substrate). The substrate SUB may in turn be situated on top of an insulating layer BX. The gate region G may have a length less than or equal to twenty eight nanometers, for example. The source and drain regions s, D here comprise only layers of metal silicide SU directly in contact with the surface of the substrate SUB, which in the present example has a P-type conductivity. A channel region RC of the substrate SUB is situated under the gate region G and between the spacers ESP. The channel region RC is not in contact with the drain D and source S regions, but is separated from the source and drain regions by separator regions RSEP. In the present example, the separator regions RSEP have a P-type conductivity, just as the region RC and the whole of the substrate SUB. It is also possible, although not required, to form a doped region RDV to adjust the threshold voltage of the transistor TR, as illustrated in FIG. 2a.

It should be noted that, in contrast to the conventional transistor $TR_{P4}$, the doped regions $RDO_{P4}$, $RFD_{P4}$ and $RDP_{P4}$ need not been included in the transistor TR. The fabrication of the transistor TR is therefore simplified, and requires fewer fabrication steps. Furthermore, the source and drain regions S, R are formed (step 20 in FIG. 2b) without implantation of dopants, e.g., by deposition of metal and then silicidation (step 200), or by epitaxial growth of a doped material (step 201). NMOS or PMOS transistors may therefore be formed by adapting the type of substrate and by eliminating the above-noted dopant implantation steps.

With further reference to FIGS. 3a to 6, examples of operation of the transistor TR will now be described with reference to graphs obtained by measurements carried out on an example test transistors. More particularly, the length of the gate G of the test transistors TR was twenty eight nanometers, the source and drain regions S, D were metal regions comprising either cobalt silicide ($CoSi_2$) or nickel silicide ($NiSi_2$). The spacers ESP were made of silicon dioxide ($SiO_2$) with a dielectric permittivity of 3.9 and had a width of four nanometers. The gate dielectric was hafnium dioxide ($HfO_2$) with a dielectric permittivity of 18.

Figure 3A:
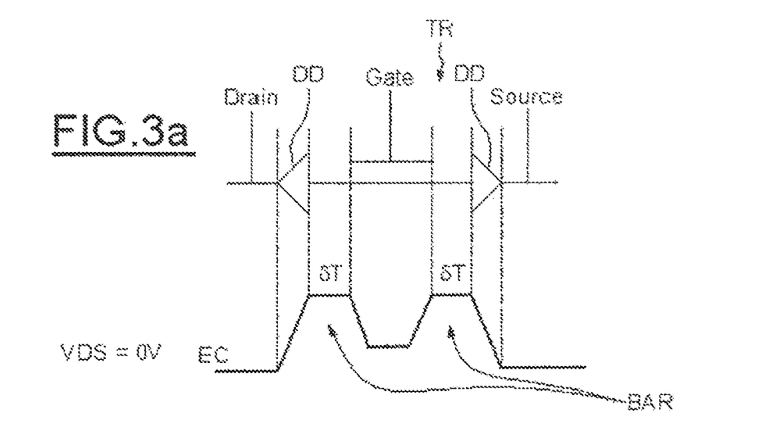
FIG. 3a is an equivalent circuit diagram for the MOS transistor of FIG. 2, and FIGS. 3b, 3c and 4 to 6 show various curves relating to the operation of the MOS transistor.

A schematic equivalent of the transistor TR is shown in FIG. 3a. At the interfaces between the metal silicides SU of the source and drain regions S, D and the separator regions RSEP, metal/semiconductor diodes DD are formed. The gate region G is represented in FIG. 3a by an electrode.

A diagram of the conduction band EC through the transistor TR is also shown in FIG. 3a. This diagram shows the appearance of two energy barriers BAR when a gate-source voltage VGS of, for example, around 1 Volt is applied. The barriers BAR have a length δT (in the source-drain direction) on the order of the length of the separator region RSEP, corresponding to the length of the spacers ESP. Furthermore, the drain-source voltage VDS is zero in the illustrated example.

Figure 3B:
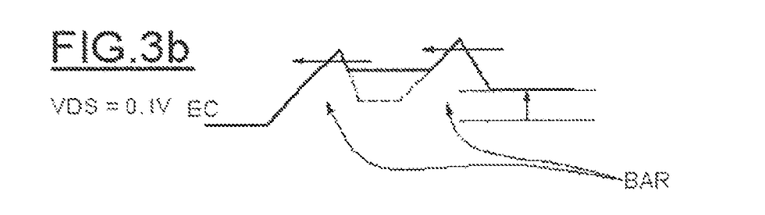

A diagram of the conduction band EC through the transistor structure TR when the voltage source-drain VDS is non-zero is shown in FIG. 3b. The solid line shows the conduction band EC for a value VDS equal to 0.1 Volt, and a low value of VGS in the range between 0 and 1 Volt. The energy barriers BAR here may be penetrated or overcome by a tunnel effect, where VDS is sufficiently high and VGS is sufficiently low.

A dashed line in FIG. 3b shows the conduction band EC for a value VDS equal to 0.1 Volt and a high value of VGS, e.g., equal to 1 Volt. The energy barriers BAR here cannot be penetrated by tunnel effect, with VGS being too high. Of course, an application of a voltage VDS having a higher value, e.g., 1 Volt, will allow the charge carriers to penetrate the energy barriers BAR.

Figure 3C:
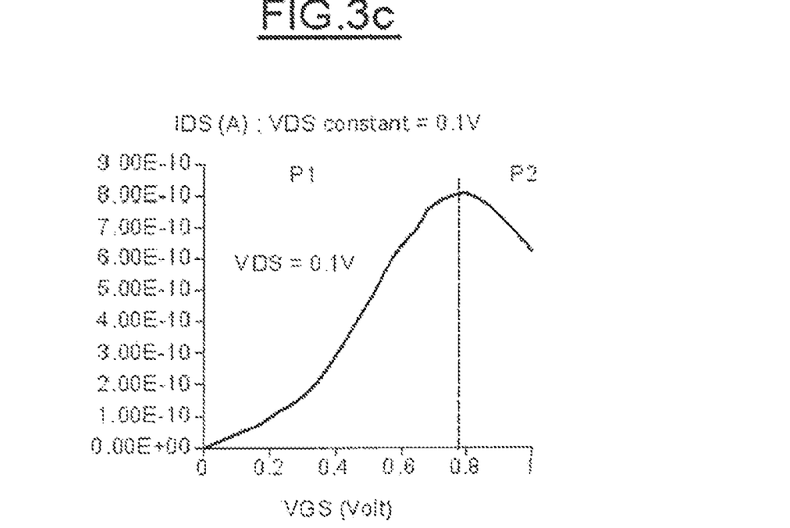

The variation of the current IDS flowing through the transistor as a function of VGS is shown in FIG. 3c. Here, the case corresponding to VDS equal to 0.1 Volt and to a low VGS (conduction band as a solid line in FIG. 3b) is illustrated in the first part P1 of the curve. The second part P2 of the curve corresponds to the non-penetration of the energy barriers (i.e., the conduction band as a dashed line in FIG. 3b).

Figures 4, 5:
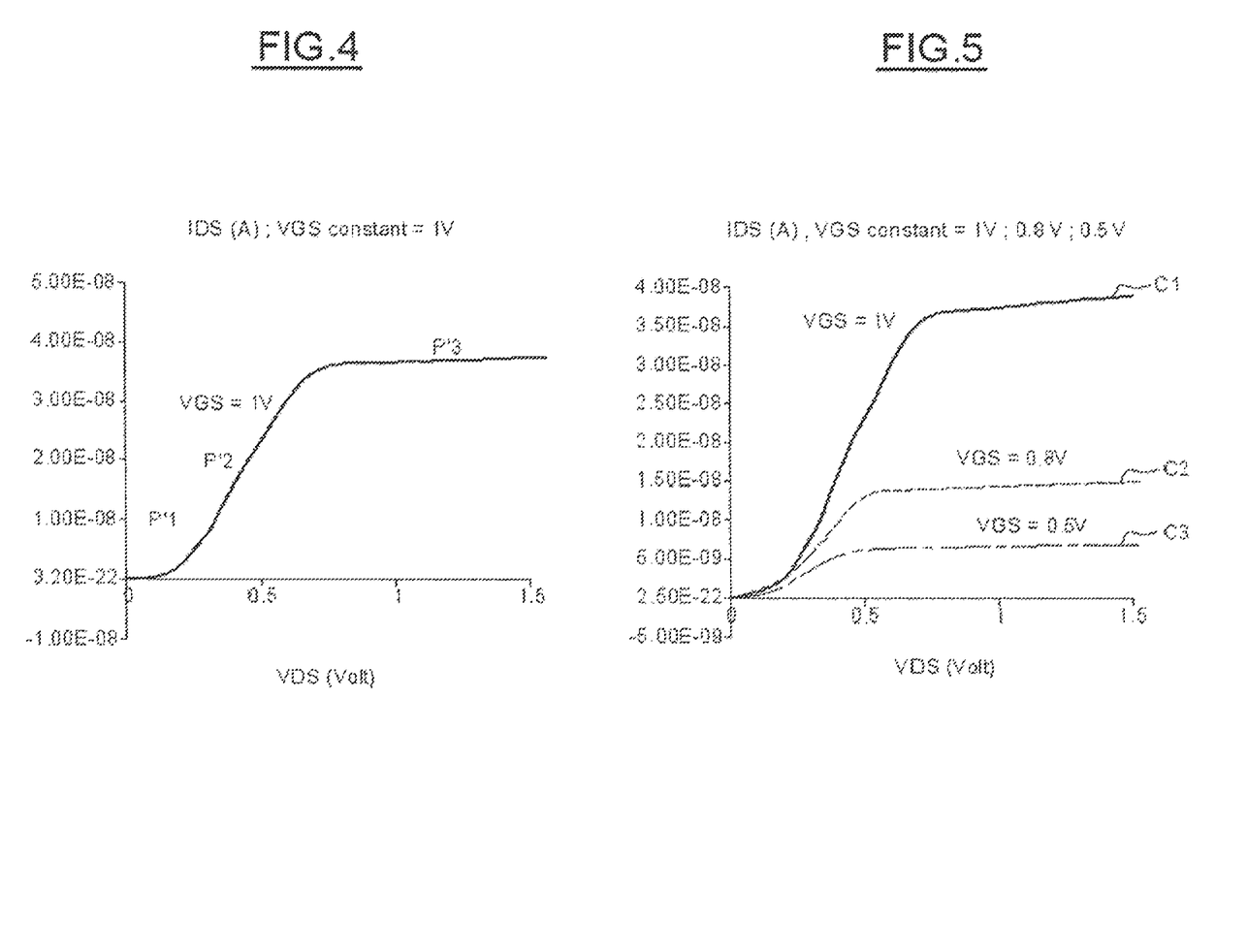

Variations of the current IDS flowing through the transistor TR as a function of the voltage VDS, for a voltage VGS of constant value equal to 1 Volt, are shown in FIG. 4. In a first part P'1 of the curve, the voltage VDS is not sufficiently high enough to allow the electrons to penetrate the barriers BAR, and the value of the current remains low. In a second part P'2 corresponding to a first inflexion of the curve, the passage of the electrons through the energy barriers BAR and the region situated under the gate region is possible. There is then an injection of electrons and passage of the current. In a third part P'3 of the curve, after a second inflexion, a saturation phenomenon appears and the value of the current IDS is no longer increasing with the voltage VDS.

The curve shown in FIG. 4 therefore exhibits a sigmoid form. In other words, the curve is in the shape of an "S". This type of transistor is therefore well suited for use in an artificial neural network, for example.

It should be noted that the transistors TR tested in the present example, for the value of voltage VGS equal to 1 Volt, exhibited a value of current IDS of around 35 nanoamperes. A conventional transistor of the same dimensions, but equipped with implanted source and drain regions may, under the same conditions, supply a current of around 700 microamperes. Aside from exhibiting a sigmoid response and having a simplified construction, the transistor TR has a particularly low power consumption. The transistor TR is therefore well adapted to low-power applications, e.g., certain portable or medical applications.

Referring to FIG. 5, three curves C1, C2 and C3 illustrating variation of the current IDS are shown as a function of the voltage VDS, and for three different values of the voltage VGS, respectively 1 Volt, 0.8 Volt and 0.5 Volt. It will be noted that the sigmoid curve can be controlled by modifying the voltage applied to the gate, and consequently controlling the value of the current flowing through the transistor TR.

Figure 6:
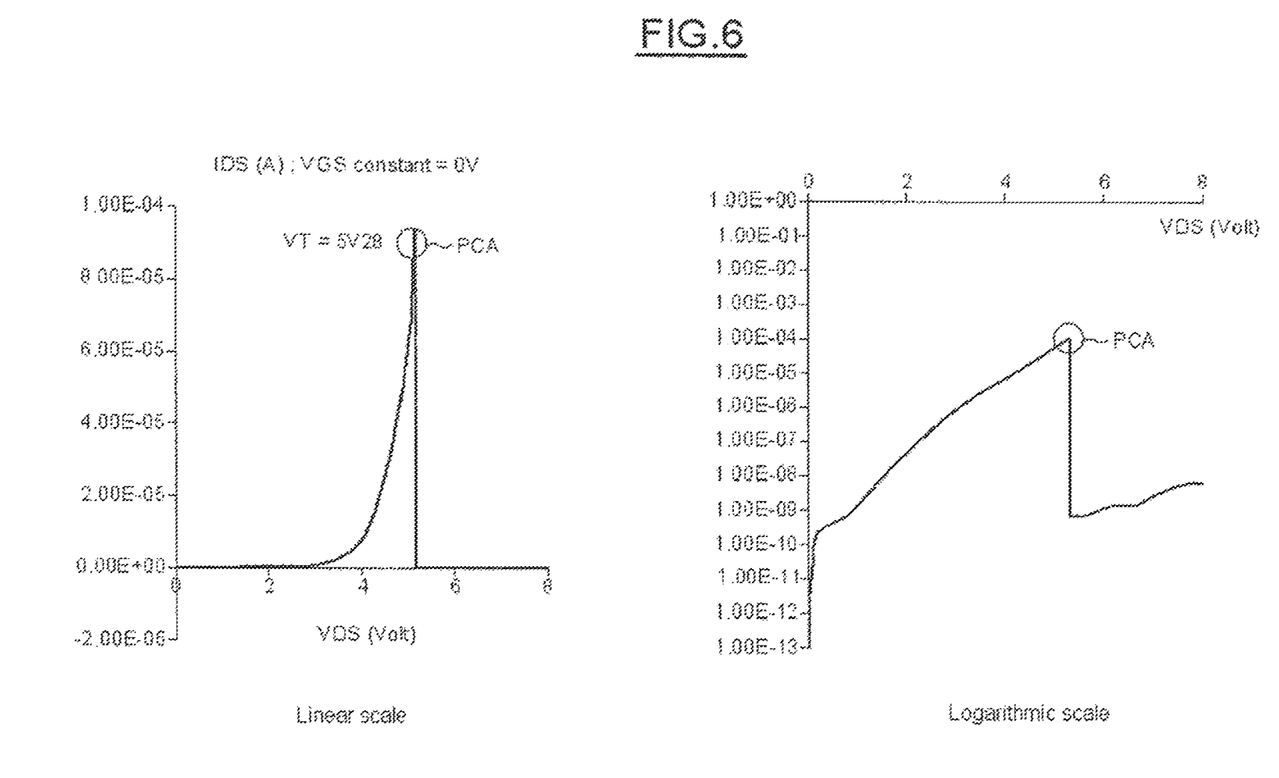

In FIG. 6, variation of the current IDS is shown as a function of the voltage VDS for a value of the voltage VGS of zero. This is done to determine the robustness of a transistor (e.g., the transistor TR described with reference to FIG. 2a above). This variation of the current IDS is shown as a function of the voltage VDS for values ranging from 0 to 8 Volts, and is illustrated with a linear scale and with a logarithmic scale. It will be noted that the breakdown point PCA corresponds to a value of the voltage VDS of 5.8 Volts. This value is particularly high. A conventional transistor having the same dimensions (in other words using 28 nanometer technology) and having source and drain regions formed by dopant implantation will generally have a breakdown point corresponding to 3 Volts. The transistor TR may therefore be considered to be more robust than a conventional transistor in this regard.

Figure 7:
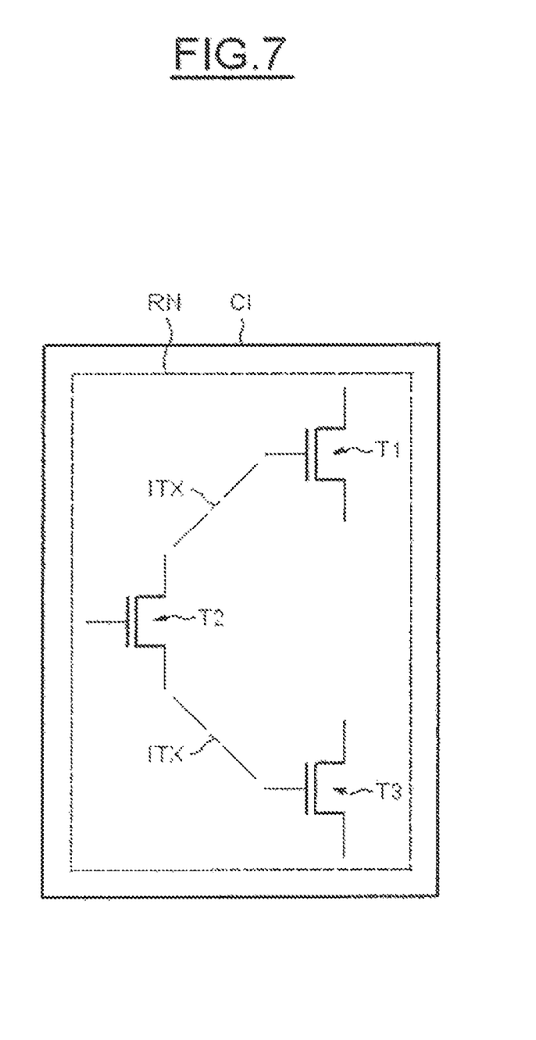
FIG. 7 is a schematic diagram of an integrated circuit including an artificial neural network according to one embodiment of the invention.

An integrated circuit CI is schematically shown in FIG. 7. The integrated circuit CI includes an artificial neural network RN. The artificial neural network RN illustratively includes a plurality of transistors Ti (where i=1, 2, 3, etc., and only three transistors T1, T2 and T3 are shown here for simplicity). Each of the transistors T1-T3 has a structure similar to that of the transistor TR (e.g., with two metal silicide electrodes on a substrate of P-type conductivity) as described with reference to FIG. 2 above, and may therefore behave as an artificial neuron. The neural network RN furthermore illustratively includes interconnections ITX for interconnecting the transistors T1-T3, and for example implementing a logical operation.

That which is claimed:
1. An integrated circuit comprising:
   at least one metal oxide semiconductor (MOS) transistor comprising
      a substrate,
      a source region and a drain region spaced apart on said substrate,
      a gate between said source region and said drain region, wherein a dimension of said gate extending between said source region and said drain region is less than or equal to twenty eight nanometers, a channel region in the substrate beneath the gate and between the source and drain regions, and a respective insulating spacer on opposing sides of said gate, said substrate having respective separator regions under each insulating spacer and separating the source region and the drain region from the channel region so that the channel region is not in physical contact with either the drain region or the source region, the channel region and the separator regions having a same conductivity type, and wherein the separator regions define respective energy barriers in the substrate such that for a constant gate-source voltage the at least one MOS transistor has a sigmoidal drain-source voltage, said source and drain regions comprising only metal layers on said substrate and without doped source and drain regions in said substrate.

2. The integrated circuit of claim 1 wherein the channel region and the separator regions have a P-type conductivity.

3. The integrated circuit of claim 1 wherein the at least one MOS transistor comprises a plurality thereof interconnected to define an artificial neural network.

4. An integrated circuit comprising:

a plurality of metal oxide semiconductor (MOS) transistors interconnected to define an artificial neural network, each MOS transistor comprising a substrate, a source region and a drain region spaced apart on said substrate, a gate between said source region and said drain region, wherein a dimension of said gate extending between said source region and said drain region is less than or equal to twenty eight nanometers, a channel region in the substrate beneath the gate and between the source and drain regions, and a respective insulating spacer on opposing sides of said gate, said substrate having a respective separator region under each of said insulating spacers and separating said source region and said drain region from the channel region so that the channel region is not in physical contact with either the drain region or the source region, the channel region and the separator regions having a same conductivity type, and wherein the separator regions define respective energy barriers in the substrate such that for a constant gate-source voltage the MOS transistor has a sigmoidal drain-source voltage, said source and drain regions comprising only metal layers on said substrate and without doped source and drain regions in said substrate.

5. A metal oxide semiconductor (MOS) transistor comprising:

a substrate;

a source region and a drain region spaced apart on said substrate;

a gate between said source region and said drain region, wherein a dimension of said gate extending between said source region and said drain region is less than or equal to twenty eight nanometers;

a channel region in the substrate beneath the gate and between the source and drain regions; and a respective insulating spacer on opposing sides of said gate;

said substrate also having respective separator regions under each insulating spacer and separating the source region and the drain region from the channel region so that the channel region is not in physical contact with either the drain region or the source region, the channel region and the separator regions having a same conductivity type, and wherein the separator regions define respective energy barriers in the substrate such that for a constant gate-source voltage the MOS transistor has a sigmoidal drain-source voltage;

said source and drain re ions comprising only metal layers on said substrate and without doped source and drain regions in said substrate.

6. The MOS transistor of claim 5 wherein the channel region and the separator regions have a P-type conductivity.

7. A method of making a metal oxide semiconductor (MOS) transistor comprising:

forming a source region and a drain region spaced apart on a substrate with a channel region in the substrate beneath the gate and between the source and drain regions, the substrate having respective separator regions between the source region and the drain region, the separator regions separating the source region and the drain region from the channel region so that the channel region is not in physical contact with either the drain region or the source region, and the channel region and separator regions having a same conductivity type;

forming a gate between the source region and the drain region on the substrate and over the channel region, wherein a dimension of the gate extending between the source region and the drain region is less than or equal to twenty eight nanometers; and forming insulating spacers on opposing sides of the gate region with each insulating spacer being over a respective separator region so that the separator regions separate the source region and the drain region from the first region, and wherein the separator regions define respective energy barriers in the substrate such that for a constant gate-source voltage the MOS transistor has a sigmoidal drain-source voltage, wherein the source and drain regions comprise only metal layers on the substrate and without doped source and drain regions in said substrate.

8. The method of claim 7 wherein forming the source and drain regions comprises forming the source and drain regions by depositing at least one of layer of metal and performing a silicidation of the at least one layer of metal.

9. The method of claim 7 wherein the channel region and the separator regions have a P-type conductivity.

* * * * *